(12) United States Patent
Constantine et al.

(10) Patent No.: US 11,374,352 B2
(45) Date of Patent: Jun. 28, 2022

(54) DUST COVER FOR AN ELECTRICAL CONNECTOR IN AN ELECTRONIC CONTROL UNIT (ECU) ASSEMBLY

(71) Applicant: Perkins Engines Company Limited, Peterborough (GB)

(72) Inventors: Martin George Constantine, Rutland, IL (US); Francis Raphael Gressani, Kent (GB); Brian Robinson, Peterborough (GB)

(73) Assignee: Perkins Engines Company Limited, Peterborough (GB)

( * ) Notice: Subject to any disclaimer, the term of this patent is extended or adjusted under 35 U.S.C. 154(b) by 0 days.

(21) Appl. No.: 17/113,474

(22) Filed: Dec. 7, 2020

(65) Prior Publication Data

US 2021/0175659 A1 Jun. 10, 2021

(30) Foreign Application Priority Data

Dec. 6, 2019 (GB) ..................................... 1917881

(51) Int. Cl.
| | |
|---|---|
| H01R 43/26 | (2006.01) |
| H01R 13/52 | (2006.01) |
| H01R 27/02 | (2006.01) |
| H01R 43/00 | (2006.01) |

(52) U.S. Cl.
CPC ......... H01R 13/5213 (2013.01); H01R 27/02 (2013.01); H01R 43/005 (2013.01); H01R 43/26 (2013.01); *H01R 2201/26* (2013.01)

(58) Field of Classification Search
CPC .. H01R 13/5213; H01R 27/02; H01R 43/005; H01R 43/26; H01R 13/5219; H01R 13/516; H01R 13/518
See application file for complete search history.

(56) References Cited

U.S. PATENT DOCUMENTS

| | | | |
|---|---|---|---|
| 6,592,384 B2 * | 7/2003 | Sawayanagi ....... | H01R 13/5202 439/157 |
| 6,695,622 B2 * | 2/2004 | Korsunsky ............. | H01R 31/06 439/631 |
| 7,381,065 B2 * | 6/2008 | Ikeda ..................... | H05K 7/026 439/76.2 |
| 8,139,364 B2 | 3/2012 | Wickett | |

(Continued)

FOREIGN PATENT DOCUMENTS

| | | |
|---|---|---|
| CN | 208978784 U | 6/2019 |
| DE | 102013214714 A1 | 1/2015 |

(Continued)

OTHER PUBLICATIONS

Great Britain Search Report related to GB Application No. GE1917881. 3; reported on Jun. 5, 2020.

*Primary Examiner* — Tho D Ta

(57) ABSTRACT

An ECU assembly includes one or more electrical connectors received in a protective cover. The cover includes an introduction aperture through which the connector or connectors can be introduced into the cover, and at least one connection aperture through which the or each connector is connected to the ECU. A retaining portion of the cover at each connection aperture is interposed between the respective connector and the ECU to retain the cover to the ECU in its use position.

14 Claims, 5 Drawing Sheets

(56) References Cited

U.S. PATENT DOCUMENTS

| | | | |
|---|---|---|---|
| 8,212,145 B2* | 7/2012 | Nagai | H01R 13/518 |
| | | | 174/59 |
| 9,190,766 B2 | 11/2015 | Lee et al. | |
| 2003/0077927 A1 | 4/2003 | Momota et al. | |
| 2005/0112940 A1* | 5/2005 | Naganishi | H01R 9/2466 |
| | | | 439/540.1 |
| 2010/0025067 A1 | 2/2010 | Nagai et al. | |
| 2014/0065849 A1* | 3/2014 | Kida | H01R 12/7011 |
| | | | 439/65 |
| 2014/0065850 A1* | 3/2014 | Takamura | H01R 13/62994 |
| | | | 439/65 |
| 2016/0240957 A1 | 8/2016 | Ludwig et al. | |
| 2017/0257959 A1 | 9/2017 | Ogitani | |
| 2018/0255658 A1 | 9/2018 | Kaneko et al. | |

FOREIGN PATENT DOCUMENTS

| | | |
|---|---|---|
| EP | 2413434 A2 | 2/2012 |
| WO | 2007096515 A1 | 8/2007 |

* cited by examiner

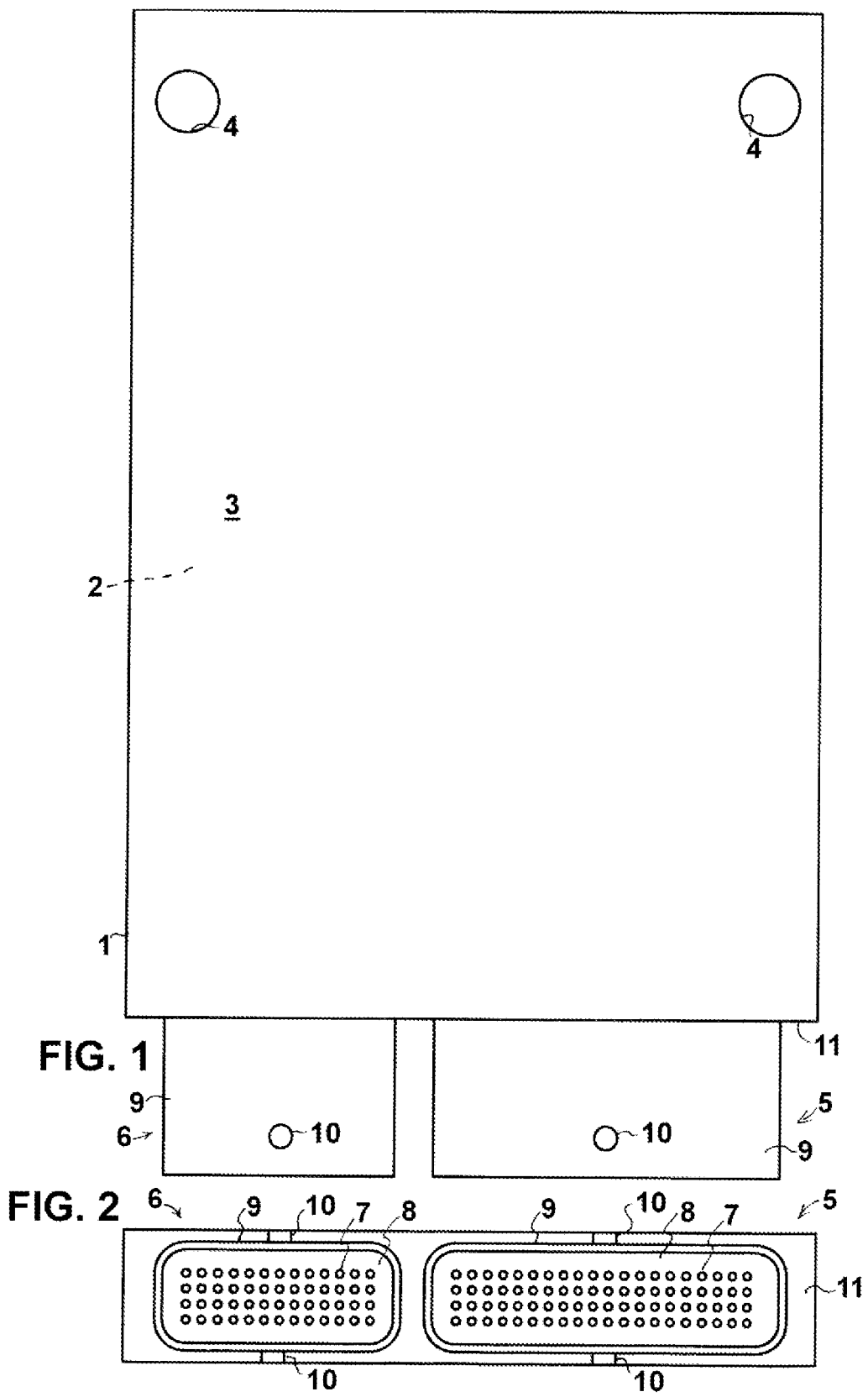

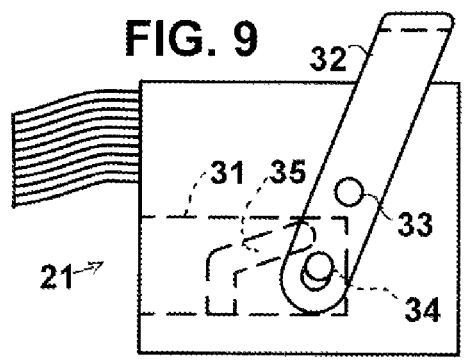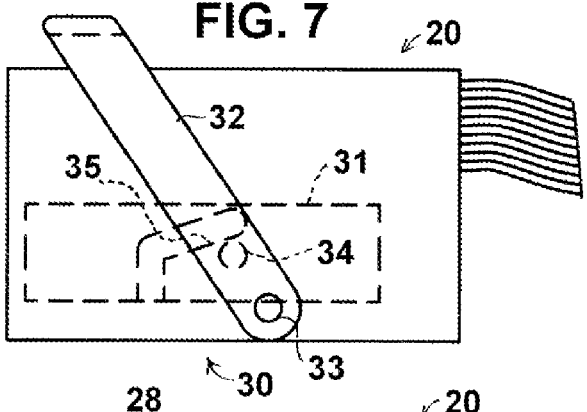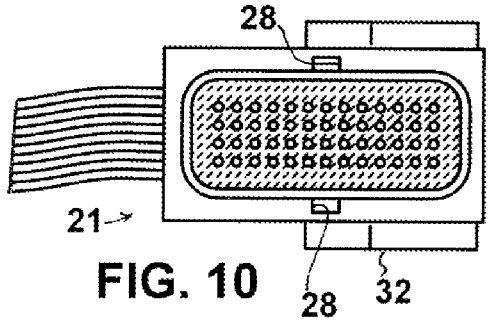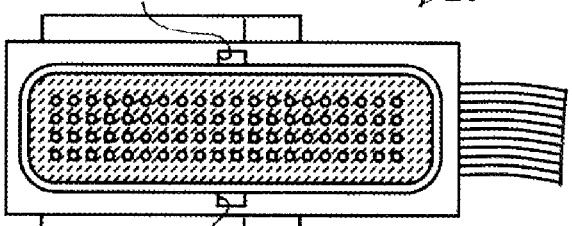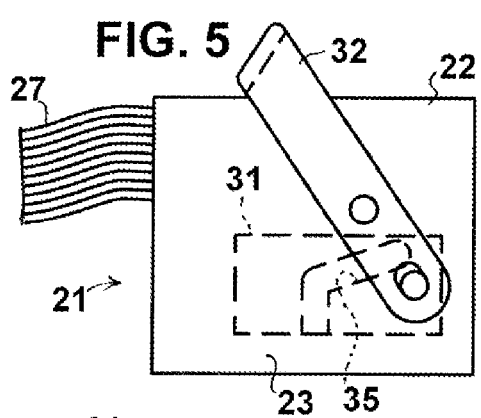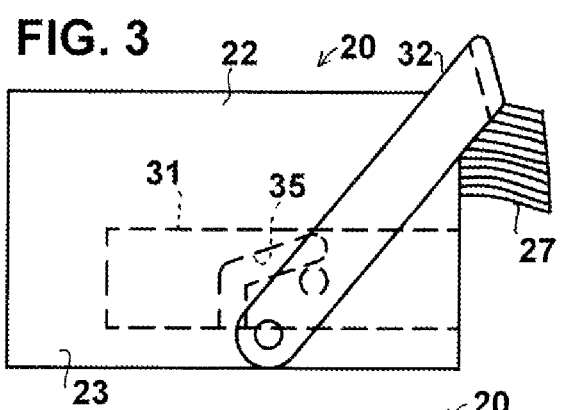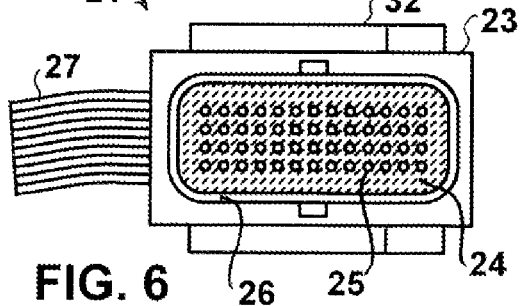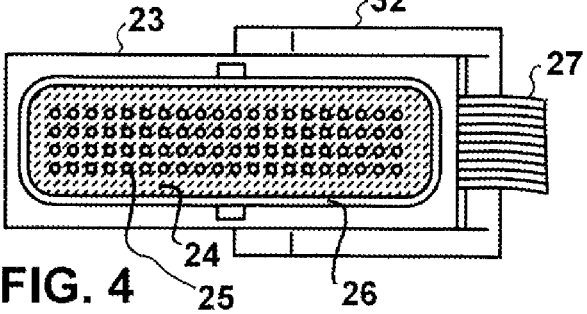

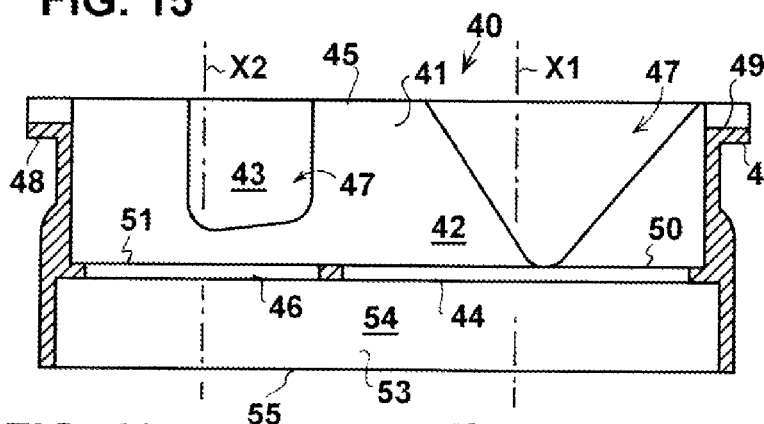
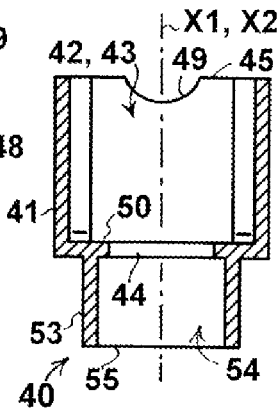
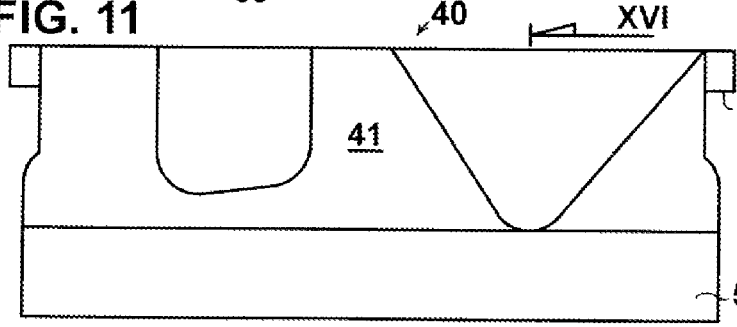
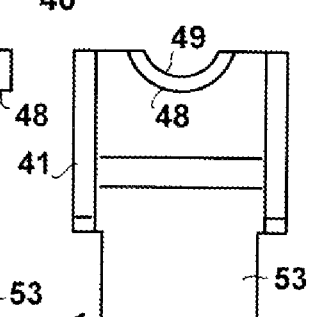
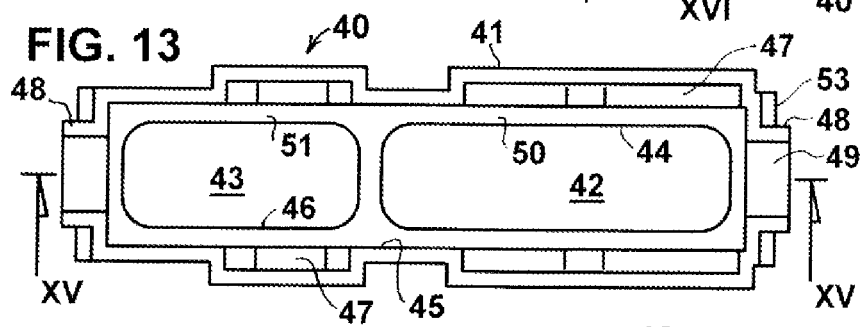
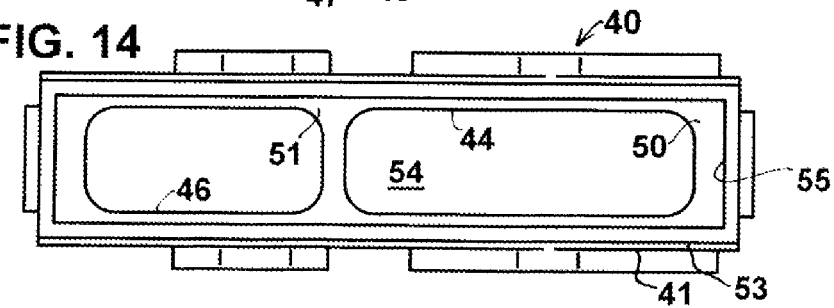

DUST COVER FOR AN ELECTRICAL CONNECTOR IN AN ELECTRONIC CONTROL UNIT (ECU) ASSEMBLY

CROSS-REFERENCE TO RELATED APPLICATION

This application claims priority under 35 USC § 119 and the Paris Convention to Great Britain Patent Application No, 1917881.3 filed on Dec. 6, 2019.

TECHNICAL FIELD

This disclosure relates to ECU assemblies including an ECU (electronic control unit) and one or more electrical connectors for connecting the ECU to external circuits.

BACKGROUND

In this specification, an ECU or electronic control unit means a module comprising electronic circuitry contained in a casing and configured to control an external electrical (or partly electrical) system to which the module is connected via one or more electrical connectors.

A vehicle (e.g. a wheeled vehicle) will often include one or more ECUs, which may include for example an engine control unit for controlling the engine of the vehicle. The circuitry of each ECU is contained inside the ECU casing, which may be made from metal and configured to dissipate heat from the circuitry, and may be mounted in the engine bay or elsewhere, either internally or externally on the chassis or bodywork of the vehicle.

ECUs, particularly engine control units, often require numerous incoming and outgoing signal pathways and so are typically connected to the vehicle wiring harness using one, two or more electrical connectors, each connector having an array of pins or receptacles defining multiple conductive pathways and mounted in a connector body. The pins or receptacles are often slender and closely spaced to reduce the size of the connectors, so that the assembly can be arranged in the restricted space available on many smaller vehicles.

In order to assist the user in correctly aligning the connector and overcoming the mechanical resistance of the multiple conductive interfaces, each connector may include a mechanism operable, e.g. by a lever to move the connector towards and away from the ECU and lock it in the connected position. This helps the user to apply sufficient force to make or break the connection without damaging the delicate conductive parts, even when the ECU is mounted in a relatively inaccessible position.

Such mechanisms are helpful when new, but it is found that dust can sometimes clog the mechanism and hinder removal of the connector. Therefore such mechanisms are often avoided in heavy construction vehicles and other vehicles subjected to dusty operating conditions. In such vehicles the casing of the ECU is typically of a relatively bulky and expensive construction with large, robust external connectors so that the user can manually insert and remove the connectors without the assistance of a lever operated mechanism.

CN208978784U teaches a protective cover for a pair of electrical connectors in an ECU assembly. The cover is made in two parts with soft rubber seals. The two parts are screwed together to enclose the connectors, with the wiring bundles extending through apertures formed between the two parts. After assembly the casing of the ECU remains exposed for heat dissipation.

This arrangement protects the connectors but adds an additional assembly step and makes the final assembly more bulky.

SUMMARY

In its various aspects the present disclosure provides, respectively: a protective cover for an ECU sub-assembly; an ECU assembly including the protective cover and the ECU sub-assembly; and a method of protecting the ECU sub-assembly against dust ingress by means of the protective cover; all as defined in the claims.

The sub-assembly includes an ECU and an electrical, first connector.

The first connector has a connected position in which the first connector is releasably connected to the ECU in a first connection interface region of the sub-assembly.

The cover includes a first wall which defines a first internal connector space. The first internal connector space communicates with a first connection aperture and a first introduction aperture formed respectively in the cover. A first connection axis of the cover extends through the first connection aperture.

The cover has a use position in which the first connector is received in its connected position in the first internal connector space with the first connection interface region extending through the first connection aperture along the first connection axis.

The first introduction aperture is configured to admit the first connector when the first connector is introduced into the first internal connector space through the first introduction aperture before connecting the first connector to the ECU.

The cover further includes a first retaining portion arranged at the first connection aperture. The first retaining portion is configured to be interposed, with respect to the first connection axis, axially in-between the first connector and the ECU in the connected position of the first connector to retain the cover to the ECU in the use position.

During assembly, the first connector is introduced through the first introduction aperture into the first internal connector space of the cover. Then, when the first connector is received in the first internal connector space, the first connector is moved along the first connection axis to connect the first connector to the ECU in its connected position with the first connection interface region extending through the first connection aperture along the first connection axis.

In this way the first retaining portion of the cover is interposed, with respect to the first connection axis, axially in-between the first connector and the ECU, so as to retain the cover to the ECU in the use position of the cover when the first connector is connected to the ECU in its connected position.

Further features and advantages will be appreciated from the illustrative embodiment which will now be described, purely by way of example and without limitation to the scope of the claims, and with reference to the accompanying drawings, in which:

BRIEF DESCRIPTION OF THE DRAWINGS

FIGS. 1 and 2 show an ECU, respectively in front view and bottom end view;

FIGS. 3 and 4 show a first connector with the locking mechanism in an unlocked position, respectively in front view and bottom view;

FIGS. 5 and 6 show a second connector with the locking mechanism in an unlocked position, respectively in front view and bottom view;

FIGS. 7 and 8 show the first connector with the locking mechanism in a locked position, respectively in front view and bottom view;

FIGS. 9 and 10 show the second connector with the locking mechanism in a locked position, respectively in front view and bottom view;

FIGS. 11 and 12 show a cover in accordance with a first embodiment, respectively in front view and end view;

FIGS. 13 and 14 show the cover, respectively in top view and bottom view;

FIGS. 15 and 16 show the cover, respectively in longitudinal section at XV (FIG. 13) and in cross-section at XVI (FIG. 11);

Reference numerals and characters appearing in more than one of the figures indicate the same or corresponding parts in each of them.

DETAILED DESCRIPTION

Figure 17:
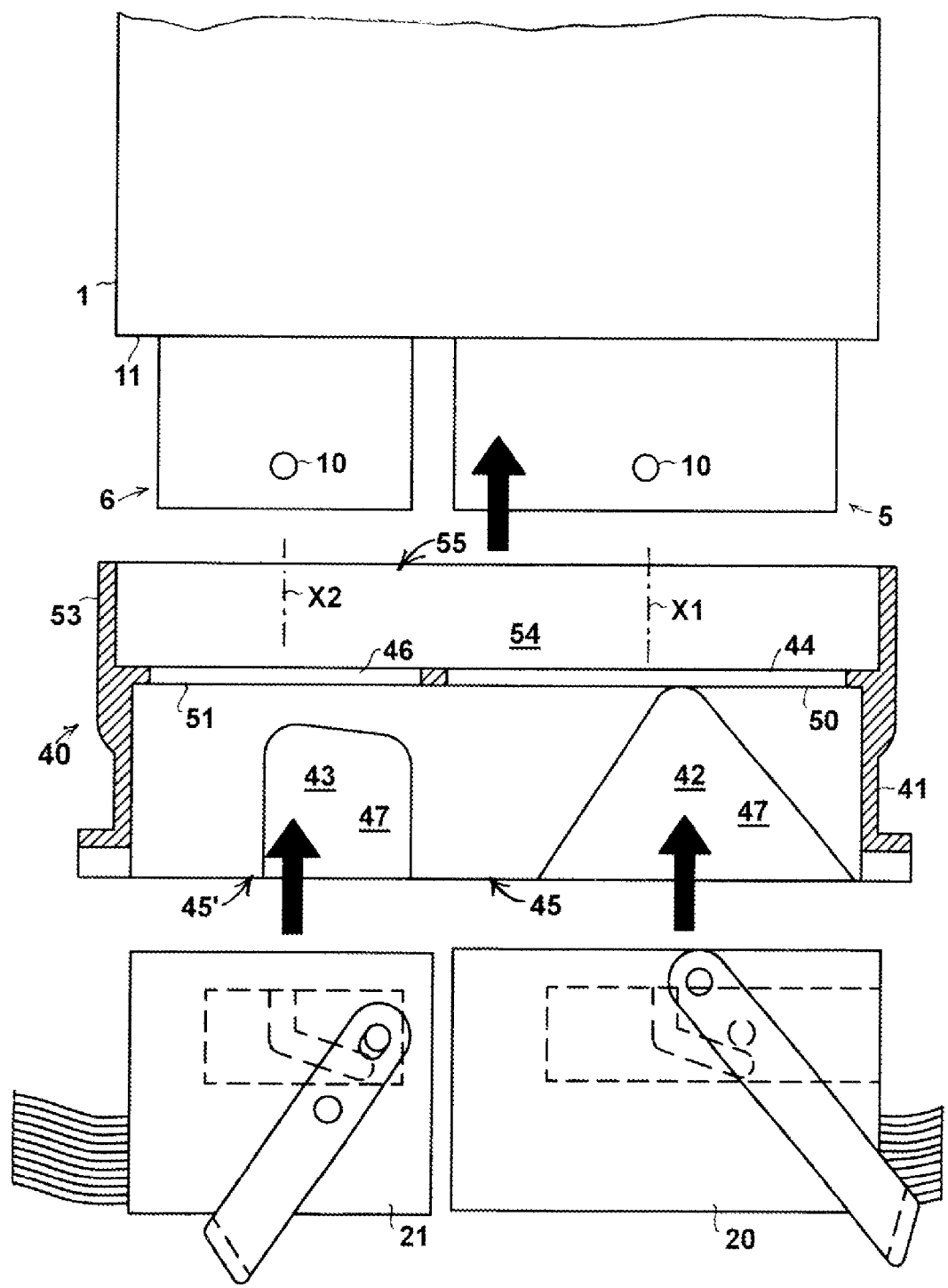
FIG. 17 shows the first and second connectors aligned with the cover and the ECU in a first stage of assembly, with the cover in longitudinal section.
Figure 19:
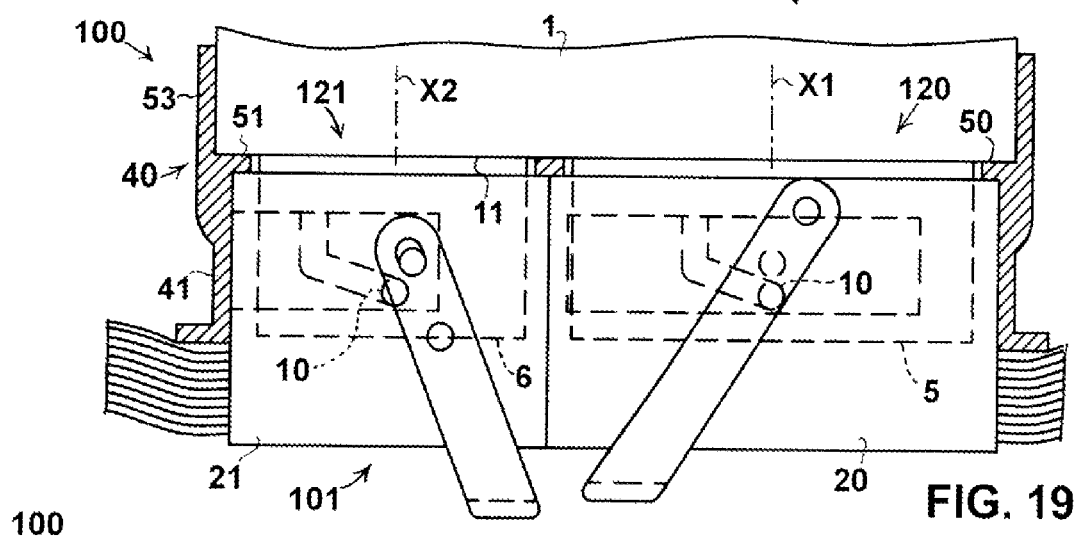
FIG. 19 shows the final assembly after actuation of the locking mechanisms.

Referring to FIGS. 17 and 19, an ECU assembly 100 includes a protective cover 40 and an ECU sub-assembly 101. The sub-assembly 101 includes an ECU 1 and first and second electrical connectors 20, 21.

Each connector 20, 21 has a connected position (FIG. 19) in which the respective, first or second connector is releasably connected to the ECU in a respective, first or second connection interface region 120, 121 of the sub-assembly 101 containing the interconnected parts of the connector and the ECU. The second connector 21 may be arranged adjacent, optionally abutting the first connector 20 in the respective, connected positions of the first and second connectors, as illustrated.

Referring now to FIGS. 1 and 2, the ECU 1 comprises electronic circuitry 2 contained in a casing 3. The casing 3 may be made from metal and may act as a heatsink for the circuitry, and may provide mounting points 4 for mounting the casing in use on a support, for example, on a wheeled or other vehicle where the ECU is configured to control an engine or other functional system of the vehicle.

The ECU includes first and second electrical interface assemblies which for convenience will be referred to as sockets 5, 6. Each socket has an array of closely spaced conductive pins 7 mounted in an insulative block 8 and surrounded by a tubular shroud 9 with short, outwardly projecting lugs 10. The pins 7 are sealingly mounted in the casing 3 which defines at its lower end a surface, referred to herein as a sealing surface 11, surrounding the tubular shrouds 9 of the sockets.

As illustrated, the sealing surface 11 of the ECU may extend in the minor, thickness dimension and a major, length or width dimension of the casing 3, with the connection axis X1, X2 extending generally normal to the sealing surface 11 in the other respective major, length or width dimension of the casing 3, so that the whole assembly 100 has a slim, flat form factor.

The ECU 1 forms a self-contained, sealed module and, when powered via various ones of the pins 7, generates control signals via other ones of the pins 7 responsive to sensor data or other signals received via further ones of the pins 7 to control an external electronic system to which it is connected via the first and second connectors 20, 21.

Referring to FIGS. 3-10, each of the first and second connectors 20, 21 is illustrated by way of example as a generally known type, having a body 22 forming a shroud 23 which surrounds an insulative block 24 containing an array of closely spaced conductive receptacles 25. A recess 26 is defined between the shroud 23 and the block 24, the recess extending inwardly into the body 22 in the axial direction of the receptacles 25.

Each receptacle 25 is connected to one conductor in the wiring bundle 27 which extends from the connector to form part of the external electrical system to which the ECU is to be connected. The wiring bundle 27 may form part of the wiring harness of a vehicle.

Each connector may further include seals (not shown) for establishing a seal between the body 22 and the shrouds 9 or casing 3 or other external parts of the ECU, and between the body and each insulated wire of the wiring bundle, so that after assembly the connectors 20, 21 cooperate with the casing 3 and shrouds 9 of the ECU and with the insulation of the wiring bundle 27 to exclude moisture from the conductive parts.

Each connector 20, 21 may include a mechanism 30 including one or more moving parts which are operable as shown to engage the ECU so as to move the connector towards and away from the ECU in the axial direction of the pins 7 and receptacles 25, thus assisting the user to overcome the mechanical resistance of the multiple conductive parts when making or breaking the connection.

In the example illustrated, the mechanism 30 comprises a pair of sliders 31 (only one of which is shown in phantom lines in the figures) which are mounted for sliding translation in the body 22 on either side of the block 24, and a lever 32 mounted on a pivot 33 on the body 22 and engaged with both sliders 31 via connections 34.

Each slider 31 has a slot 35 defining linear cam surfaces which engage a respective one of the lugs 10 on the ECU when the tubular shroud 9 is received in the recess 26 of the connector. A small groove 28 is formed in the inwardly facing surface of the shroud 23 on either side of the block 24 to accommodate the lug 10 as it passes into the slot 35.

By operating the lever 32 each slider 31 is urged from the unlocked position (FIGS. 3, 4, 5, 6), in which the slot 35 opens into the groove 28, to the locked position (FIGS. 7, 8, 9, 10) in which the slot 35 is displaced away from the groove 28. The locked position is so-called for convenience because in that position the mechanism 30 may function also to lock the connector to the ECU to prevent unintended disconnection.

In the locked position, the position of the lug 10 in the slot 35 is axially further from the open end of the shroud 23 than in the unlocked position, so that the connector 20, 21 is drawn towards the respective socket 5, 6 of the ECU by movement of the slider 31, urging the pins 7 to enter into the receptacles 25 of the connector. Disconnection is accomplished by moving the lever in the opposite direction.

Referring now to FIGS. 11-16, in the illustrated embodiment, the cover 40 includes a first wall 41 which defines first and second internal connector spaces 42, 43 to receive, respectively the first and second connectors 20, 21 in their connected positions as shown in FIG. 19. The cover is configured to allow the wiring bundles 27 to extend away from the connectors in use, and may include protective cowls 48 that extend from the first wall to protect the wiring bundles 27 at the point where they leave the cover.

In the illustrated embodiment, the first and second connectors 20, 21 abut one another in their connected positions and so the internal connector spaces 42, 43 are not separated by a partition, but they could be separated if desired to suit alternative arrangements of the connectors.

Figure 18:
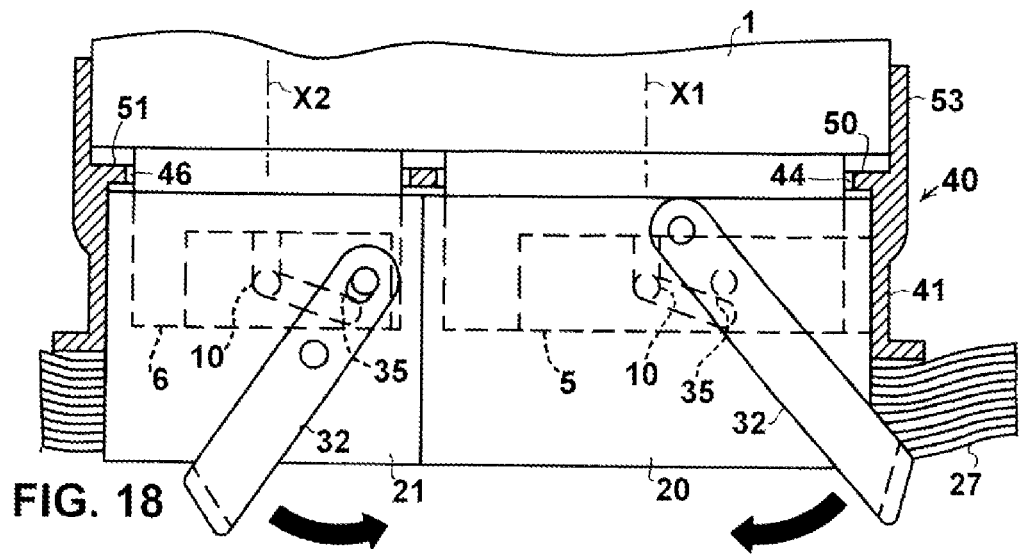
FIG. 18 shows the components of FIG. 17 partially assembled before actuation of the locking mechanisms.
Figure 20:
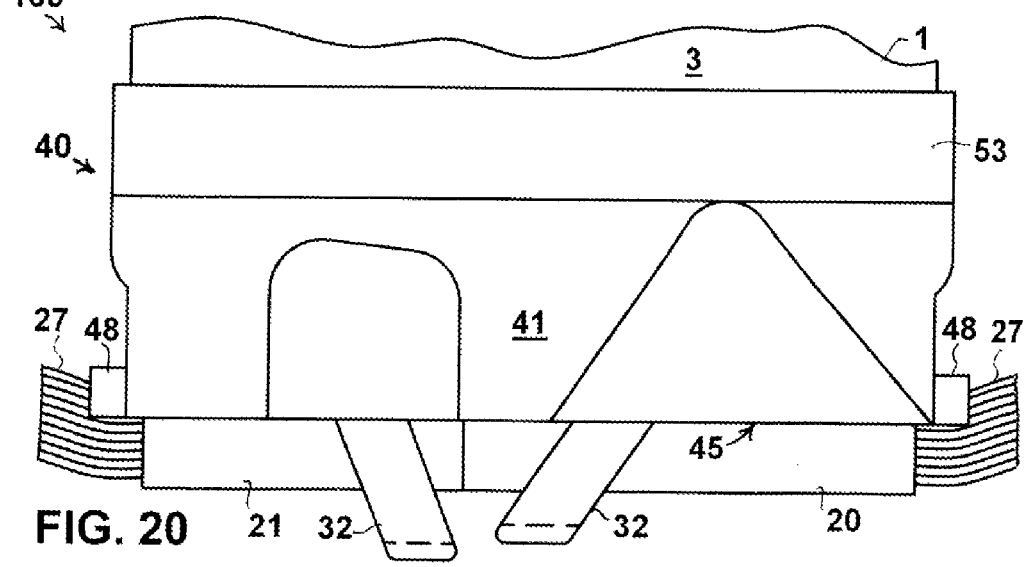
FIG. 20 is an outside view of the final assembly of FIG. 19.

The first wall 41 may be configured as shown to define locally widened regions 47 of the internal connector spaces to accommodate the movement of the levers 32 of the two connectors during assembly. This allows the levers to be operated inside the cover through their range of movement between the unlocked and locked positions, as best seen in FIGS. 18-20.

The first internal connector space 42 communicates with a first connection aperture 44 and a first introduction aperture 45 formed respectively in the cover. Conveniently, the first introduction aperture 45 may be formed at an axial end of the first wall 41 axially opposite the first connection aperture 44, and may afford access for the wiring bundles 27 to extend through the first introduction aperture in the use position of the cover, optionally through small recesses 49 alongside the cowls 48 as shown. A first connection axis X1 of the cover extends through the first connection aperture 44, and may also extend through the first introduction aperture 45, as shown.

The second internal connector space 43 communicates with a second connection aperture 46 formed in the cover. The second internal connector space 43 also communicates with the first introduction aperture 45. A second connection axis X2 of the cover extends in parallel with the first connection axis X1 through the second connection aperture 46, and may also extend through the first introduction aperture 45, as shown.

The first introduction aperture 45 is configured to admit each of the first and second connectors 20, 21 when each connector is introduced into the respective, first or second internal connector space 42, 43 through the first introduction aperture 45 before connecting the connector to the ECU 1.

The cover further includes first and second retaining portions 50, 51 which are arranged respectively at the first and second connection apertures 44, 46.

Each of the first and second retaining portions 50, 51 may extend inwardly from the first wall 41 to encircle the respective, first or second connection aperture 44, 46, as shown.

In this specification, to encircle means to continuously surround, and does not imply a circular shape. The connection apertures may have an elongate shape as shown or any other shape to accommodate the profile of the connector.

In use, the first and second connection apertures 44, 46 accommodate respectively the first and second connection interface regions 120, 121 while each of the first and second retaining portions 50, 51 is interposed between the respective connector 20, 21 and the ECU 1 to retain the cover 40 in its use position, and optionally also to seal the cover 40 to the or each connector 20, 21 and/or to the ECU 1, as further explained below.

The cover 40 may further include a second wall 53 configured so that the first and second walls 41, 53 extend away from the retaining portions 50, 51 in opposite directions of the first connection axis X1. The second wall 53 defines an internal ECU space 54 and an ECU aperture 55, the internal ECU space 54 communicating with the or each connection aperture 44, 46 and with the ECU aperture 55 while the first connection axis X1 extends through the ECU aperture 55. Thus, each of the first and second connection apertures 44, 46 may be axially aligned with a respective region of each of the first introduction aperture 45 and the ECU aperture 55, as shown.

Referring now to FIGS. 17-20, during assembly, the first connector 20 is introduced through the first introduction aperture 45 into the first internal connector space 42 of the cover 40. Then, when the first connector 20 is received in the first internal connector space 42, the first connector 20 is moved along the first connection axis X1 to connect the first connector 20 to the ECU 1 in its connected position (FIG. 19) with the first connection interface region 120 extending through the first connection aperture 44 along the first connection axis X1.

The second connector 21 is introduced in a similar way through the first introduction aperture 45, either simultaneously or consecutively with the first connector 20, into the second internal connector space 43, and then is moved along the second connection axis X2 to connect it to the ECU 1 in its connected position with the second connection interface region 121 extending through the second connection aperture 46 along the second connection axis X2.

During assembly the parts are oriented as shown in FIG. 17 with the connector mechanism 30 of each connector in the unlocked position. The cover 40 may be assembled to the ECU 1 either before, after or simultaneously with assembly of the connectors 20, 21 into the cover 40. Once inside the cover, the connectors 20, 21 are engaged with the sockets 5, 6 of the ECU as shown in FIG. 18, and then the levers 32 are pivoted inside the cover in the direction of the arrows to urge the connectors 20, 21 into their fully connected, locked position to retain the cover in its use position, as shown in FIGS. 19 and 20.

In the use position of the cover 40 as shown in FIGS. 19 and 20, each connector 20, 21 is received in the respective, first or second internal connector space 42, 43 of the cover and connected to the ECU in its connected position, with each connection interface region 120, 121 extending through the respective, first or second connection aperture 44, 46 along the respective connection axis X1, X2.

In the use position of the cover it can be seen that each of the first and second retaining portions of the cover is interposed, with respect to the respective connection axis X1, X2, axially in-between the respective connector 20, 21 and the sealing surface 11 of the ECU 1, so as to retain the cover to the ECU in its use position.

Each retaining portion 50, 51 may be configured to sealingly engage the respective connector 20, 21 to seal the respective connection aperture 44, 46 when the retaining portion is compressively engaged between the respective connector and the sealing surface 11 of the ECU 1 in the use position of the cover 40, as shown in FIG. 19.

Where as illustrated the or each connector includes a mechanism 30 which is operated to move the connector towards the ECU along the connection axis X1, X2 in the use position of the cover, the or each retaining portion 50, 51 may be configured so that it is sealingly engaged in compression between the respective connector 20, 21 and the ECU 1 as the connector 20, 21 is urged towards the ECU 1 by operation of the mechanism 30. This provides a simple and satisfactory seal without any additional step.

In the illustrated embodiment, each retaining portion 50, 51 is configured as a simple internal flange which is pressingly engaged against the sealing surface 11 of the ECU to seal the cover 40 around each of the connectors 20, 21 and to the ECU 1. In alternative embodiments, the retaining portion 50, 51 could be configured for example with a lip or wall or other feature to extend, for example, axially with respect to the connection axis X1, X2 so as to accomplish an effective seal.

Alternatively or additionally, the second wall 53 may be configured as shown to sealingly encircle the ECU 1 when the ECU is received in the internal ECU space 54 to extend through the ECU aperture 55 in the use position of the cover 40.

In this specification, to "seal" means to close so as to at least reduce the ingress of dust or another target contaminant that is to be excluded. An adequate seal may be obtained without perfectly excluding the target contaminant. For example, where the seal is configured to ensure continued operability of a connector mechanism in a dusty environment, a partial reduction in dust ingress may be adequate. Related terms such as "sealingly" are to be construed accordingly.

The entire cover 40, or at least part of the cover including the first wall 41 and the or each retaining portion 50, 51 may be moulded integrally (i.e. in one piece) from elastomeric material, e.g. a natural or synthetic rubber. This provides cost effective manufacture and assists the cover in its use position to sealingly engage the outer surface of the or each connector 20, 21 and the ECU 1 while minimising the overall bulk of the resulting assembly, as shown in FIGS. 19 and 20.

The cover 40 may be configured as shown to expose at least most of the casing 3 of the ECU 1 in its use position, so that heat dissipation is unaffected by the presence of the cover 40.

As shown in FIGS. 19 and 20, the assembly may be arranged in use with the or each introduction aperture 45 not sealed but in a downwardly facing orientation. The first wall 41 may be configured to define a downwardly open skirt which extends downwardly around the connectors 20, 21. In the downwardly facing orientation, the wiring bundles 27 may extend out from under the protective cowls 48.

In summary, an ECU assembly 100 includes one or more electrical connectors 20, 21 received in a protective cover 40. The cover includes an introduction aperture 45 through which the connector or connectors can be introduced into the cover, and at least one connection aperture 44, 46 through which the or each connector is connected to the ECU. A retaining portion 50, 51 of the cover at each connection aperture 44, 46 is interposed between the respective connector 20, 21 and the ECU 1 to retain the cover 40 to the ECU 1 in its use position.

In alternative embodiments (not shown), the cover may be configured to allow the first introduction aperture to be sealed, for example, by sealingly connecting the end region of the first wall at the introduction aperture to itself to close the introduction aperture and sealingly surround the wiring bundle or bundles of the or each connector. An adequate seal could be accomplished for example by a clip, hook-and-loop material or other fastener type configured to join together two edge regions of sheet material as well known in the art. For example, the first wall may be provided with a flap extending from the introduction aperture, which can be folded over and around the wiring bundles and closed by a fastener or fasteners such as a clip, ties, press studs, hook-and-loop material or the like so as to hold it in place to substantially exclude dust from the internal connector space within the cover.

Instead of providing locally widened regions 47 of the internal connector spaces that are large enough to accommodate movement of the levers 32 as shown, the first wall could be arranged to deform resiliently as the levers are moved to the locked position and then to conform sealingly to the contour of each lever and connector body in the locked position of the connectors after assembly.

The first connection aperture 44 could be configured to accommodate both the first and second connection interface regions 120, 121, and the second internal connector space 43 configured to communicate with the first connection aperture 44, in which case only one connection aperture may be provided for both connectors.

Instead of communicating with the first introduction aperture 45, the second internal connector space 43 could communicate with a second, separate introduction aperture 45' formed in the cover, through which the second connector 21 is introduced into the second internal connector space 43. (Reference numeral 45' indicates a possible position of the second introduction aperture, but the partition or wall of the cover separating the first and second introduction apertures is not shown.) Additional introduction apertures, optionally also additional connection apertures, could be provided for additional connectors.

Thus, the cover could be configured to receive only one, or more than two connectors, in which case it may include only one retaining portion and only a first internal connector space and connection aperture for a single connector, or alternatively, more than two internal connector spaces and more than two connection apertures (or only a single, common connection aperture) defining retaining portions for more than two connectors, which may be introduced into the cover via a single introduction aperture or separate introduction apertures.

The ECU could have one, two or more than two electrical interface assemblies of any configuration to receive one, two or more complementary electrical connectors, which may be connected to the ECU and enclosed by the cover generally as described, optionally side by side as shown. The ECU and the connectors could be configured differently from those illustrated. For example, the ECU could have receptacles and the connectors could have pins, the connector body could be a different shape, or the connector mechanism could be absent or of a different type, as well known in the art.

The ECU could present a sealing surface which is positioned or oriented differently from that illustrated to receive the or each retaining portion, and the cover may be configured to conform to the outer contours of the specific ECU to which it is to be mounted. The or each retaining portion could also be interposed between the connector and a different part of the ECU from that illustrated. For example, the retaining portion could seal against an axial end of a shroud such as the shroud 9 forming part of the connection interface on the ECU.

Many further adaptations are possible within the scope of the claims.

INDUSTRIAL APPLICABILITY

The novel cover may be used to reduce the ingress of dust into one or more connectors in an ECU assembly at relatively low cost and without significantly increasing the size of the assembly. Since the cover is retained and, preferably, sealed between the connector and the ECU by engaging the connector with the ECU at the connection aperture, no additional assembly steps are required after introducing the connector into the cover. Moreover, since the connector is introduced into the cover via an introduction aperture separate from the connection aperture, the connector may be equipped with a lever and sliders or other locking mechanism which can be manipulated by the user to urge the connector into its connected position and, at the same time, to secure the retaining portion of the cover between the connector and the ECU.

In tests, it is found that by arranging the assembly with the introduction aperture unsealed and in a downwardly facing position, the ingress and build-up of dust in the connector may be reduced to a sufficient extent to ensure that a mechanism with intricate parts such as a lever and slider mechanism remains operable even after extended service in severely dusty conditions, without obstructing access to the connector. By sealingly engaging the retaining portion with the connector around the connection aperture, dust is prevented from entering the upper end of the internal connector space, while the downwardly facing introduction aperture allows dust loosened by vibration in service (e.g. on a moving vehicle) to fall out of the cover. A second wall may be arranged to sealingly encircle the ECU to ensure a good seal at the upper end of the cover in case the ECU should offer only a narrow sealing surface 11 to engage the retaining portion.

The cover also provides protection when the assembly is arranged in other orientations. In alternative embodiments the introduction aperture can be closed, e.g. by a flap extending from the first wall, which may be desirable if the assembly is installed in a different orientation in wet or dusty conditions.

In the claims, reference numerals and characters are provided in parentheses, purely for ease of reference, and are not to be construed as limiting features.

What is claimed is:

1. A protective cover for an ECU (electronic control unit) sub-assembly, the sub-assembly including an ECU and an electrical, first connector;
    the first connector having a connected position in which the first connector is releasably connected to the ECU in a first connection interface region of the sub-assembly;
    a mechanism for unlocking and locking the first connector connected to the ECU in the first connection interface region, the mechanism comprising a slider within a body of the first connector and a lever mounted on a pivot engaged with the slider, the lever moves the slider from an unlocked to a locked position when unlocking and locking the first connector to the ECU;
    the cover including a first wall, the first wall defining a first internal connector space, the first internal connector space communicating with a first connection aperture and a first introduction aperture formed respectively in the cover, wherein a first connection axis of the cover extends through the first connection aperture;
    the first wall further configured to allowthe mechanism to be operable within the cover;
    the cover having a use position in which the first connector is received in its connected position in the first internal connector space with the first connection interface region extending through the first connection aperture along the first connection axis;
    wherein the first introduction aperture is configured to admit the first connector when the first connector is introduced into the first internal connector space through the first introduction aperture before connecting the first connector to the ECU;
    the cover further including a first retaining portion;
    the first retaining portion being arranged at the first connection aperture and configured to be interposed, with respect to the first connection axis, axially in-between the first connector and the ECU in the connected position of the first connector to retain the cover to the ECU in the use position.

2. A protective cover according to claim 1, wherein the first retaining portion extends inwardly from the first wall to encircle the first connection aperture.

3. A protective cover according to claim 2, wherein the first retaining portion is configured to sealingly engage the first connector to seal the first connection aperture in the use position of the cover.

4. A protective cover according to claim 1, wherein the first connection axis extends through the first introduction aperture.

5. A protective cover according to claim 1, wherein the first wall and the first retaining portion are moulded integrally from elastomeric material.

6. A protective cover according to claim 1, wherein the cover includes a second wall, the first and second walls extending away from the first retaining portion in opposite directions of the first connection axis;
    the second wall defining an internal ECU space and an ECU aperture, the internal ECU space communicating with the first connection aperture and the ECU aperture, the first connection axis extending through the ECU aperture;
    the second wall being configured to sealingly encircle the ECU when the ECU is received in the internal ECU space to extend through the ECU aperture in the use position of the cover.

7. A protective cover according to claim 1, wherein the sub-assembly includes an electrical, second connector, the second connector having a connected position in which the second connector is releasably connected to the ECU in a second connection interface region of the sub-assembly;
    the second connector being arranged adjacent the first connector in the respective, connected positions of the first and second connectors;
    the first wall defining a second internal connector space, the second internal connector space communicating, either with the first connection aperture or with a second connection aperture formed in the cover;
    the second internal connector space being configured to receive the second connector in the connected position of the second connector, with the second connection interface region extending through the first or second connection aperture along a second connection axis parallel with the first connection axis in the use position of the cover;
    the second internal connector space further communicating, either with the first introduction aperture or with a second introduction aperture formed in the cover;
    the first or second introduction aperture being configured to admit the second connector when the second connector is introduced into the second internal connector space through the respective, first or second introduction aperture before connecting the second connector to the ECU;
    the cover further including a second retaining portion, the second retaining portion being arranged at the respective, first or second connection aperture through which the second connection interface region extends in use, and configured to be interposed, with respect to the second connection axis, axially in-between the second connector and the ECU in the connected position of the second connector to retain the cover to the ECU in the use position.

8. A protective cover according to claim 7, wherein said second connection aperture is formed in the cover, the second connection interface region extending through the second connection aperture along the second connection axis in the connected position of the second connector in the use position of the cover; and the first and second retaining portions extend inwardly from the first wall to encircle respectively the first and second connection apertures.

9. An ECU (electronic control unit) assembly, the assembly including a protective cover and an ECU sub-assembly, the sub-assembly including an ECU and an electrical, first connector;

the first connector having a connected position in which the first connector is releasably connected to the ECU in a first connection interface region of the sub-assembly;

a mechanism for unlocking and locking the first connector connected to the ECU in the first connection interface region, the mechanism comprising a slider within a body of the first connector and a lever mounted on a pivot engaged with the slider, the lever moves the slider from an unlocked to a locked position when unlocking and locking the first connector to the ECU;

the second connector having a connected position in which the second connector is releasably connected to the ECU in a second connection interface region of the sub-assembly;

the cover including a first wall, the first wall defining a first internal connector space, the first internal connector space communicating with a first connection aperture and a first introduction aperture formed respectively in the cover, wherein a first connection axis of the cover extends through the first connection aperture;

the first wall further configured to allowthe mechanism to be operable within the cover;

the cover having a use position in which the first connector is received in its connected position in the first internal connector space with the first connection interface region extending through the first connection aperture along the first connection axis;

wherein the first introduction aperture is configured to admit the first connector when the first connector is introduced into the first internal connector space through the first introduction aperture before connecting the first connector to the ECU;

the cover further including a first retaining portion, the first retaining portion being arranged at the first connection aperture and configured to be interposed, with respect to the first connection axis, axially in-between the first connector and the ECU in the connected position of the first connector to retain the cover to the ECU in the use position, the first wall further defining a second internal connector space, the second internal connector space capable of communicating, either with the first connection aperture or with a second connection aperture formed in the cover;

the second internal connector space being configured to receive the second connector in the connected position of the second connector, with the second connection interface region extending through the first or second connection aperture along a second connection axis parallel with the first connection axis in the use position of the cover;

the second internal connector space further communicating, either with the first introduction aperture or with a second introduction aperture formed in the cover.

10. An assembly according to claim 9, wherein the mechanism is operable to move the first connector towards the ECU along the first connection axis (X1) in the use position of the cover, and the first retaining portion is configured to be sealingly engaged in compression between the first connector and the ECU by operation of the mechanism.

11. An assembly according to claim 9, wherein the first introduction aperture is not sealed, and the assembly is arranged with the first introduction aperture in a downwardly facing orientation.

12. A method of protecting an ECU (electronic control unit) sub-assembly against dust ingress, the sub-assembly including an ECU and an electrical, first connector comprising a mechanism for unlocking and locking the first connector connected to the ECU in the first connection interface region, the mechanism comprising a slider within a body of the first connector and a lever mounted on a pivot engaged with the slider, the lever moves the slider from an unlocked to a locked position when unlocking and locking the first connector to the ECU;

the first connector having a connected position in which the first con nector is releasably connected to the ECU in a first connection interface region of the sub-assembly;

the method including:
providing a protective cover, the cover including a first wall, the first wall defining a first internal connector space, the first internal connector space communicating with a first connection aperture and a first introduction aperture formed respectively in the cover, wherein a first connection axis of the cover extends through the first connection aperture, the first wall being further configured to allowthe mechanism to be operable within the cover;

introducing the first connector through the first introduction aperture into the first internal connector space; and then, when the first connector is received in the first internal connector space, moving the first connector along the first connection axis to connect the first connector to the ECU in its connected position with the first connection interface region extending through the first connection aperture along the first connection axis; and further including:

interposing a first retaining portion of the cover, with respect to the first connection axis, axially in-between the first connector and the ECU;

the first retaining portion being arranged at the first connection aperture to retain the cover to the ECU in a use position of the cover when the first connector is connected to the ECU in its connected position.

13. A method according to claim 12, further including: operating the mechanism of the first connector to move the first connector towards the ECU along the first connection axis; and sealingly engaging the first retaining portion in compression between the first connector and the ECU by operation of the mechanism.

14. A method according to claim 12, further including: arranging the sub-assembly with the cover in its use position and with the first introduction aperture unsealed and in a downwardly facing orientation.

\* \* \* \* \*